United States Patent [19]
Ammenheuser

[11] 3,932,016
[45] Jan. 13, 1976

[54] PRINTED CIRCUIT CARD RECEPTACLE

[75] Inventor: Herbert H. Ammenheuser, Henrietta, N.Y.

[73] Assignee: Stromberg-Carlson Corporation, Rochester, N.Y.

[22] Filed: Feb. 4, 1974

[21] Appl. No.: 439,493

Related U.S. Application Data

[63] Continuation-in-part of Ser. No. 347,273, April 2, 1973, abandoned.

[52] U.S. Cl.......... 339/65; 339/75 MP; 317/101 DH
[51] Int. Cl.².................. H01R 13/62; H01R 13/54
[58] Field of Search............ 339/17, 65, 66, 75, 91, 339/176; 317/101 DH; 211/41

[56] References Cited
UNITED STATES PATENTS

| | | | |
|---|---|---|---|
| 3,216,580 | 11/1965 | Fricker, Jr. .................... | 339/75 MP |
| 3,693,135 | 9/1972 | Vavrick et al. ............. | 339/176 MP |
| 3,696,936 | 10/1972 | Straccia et al. ...................... | 211/41 |
| 3,711,814 | 1/1973 | Pomella et al. ...................... | 339/65 |
| 3,714,513 | 1/1973 | Marconi ............................... | 211/41 |
| 3,762,574 | 10/1973 | Bentley et al. ................. | 339/17 LM |
| 3,768,066 | 10/1973 | Mattingly, Jr. et al. ............. | 339/65 |
| 3,801,953 | 4/1974 | Lynch .................................. | 339/65 |
| 3,829,741 | 8/1974 | Athey ........................... | 317/101 DH |

*Primary Examiner*—Joseph H. McGlynn
*Attorney, Agent, or Firm*—Edward A. Gerlaugh; William F. Porter, Jr.

[57] ABSTRACT

A printed circuit card receptacle formed of one or more edge connectors having a pair of opposed, slotted card guides affixed thereto. The receptacle includes a mountable connector having a channel member at either end thereof for receiving the guide. Each card guide has a sleeve portion for slideably engaging the channel member and a releaseable locking means for holding the card guide affixed in place after full engagement of the sleeve with the channel member. The receptacle includes means for holding the printed circuit card in the connector.

3 Claims, 8 Drawing Figures

PRINTED CIRCUIT CARD RECEPTACLE

CROSS-REFERENCE

This is a continuation-in-part of my copending U.S. patent application, Ser. No. 347,273, filed Apr. 2, 1973, now abandoned.

BACKGROUND OF THE INVENTION

This invention pertains generally to electrical connectors and specifically to a printed circuit card (PCC) receptacle and an arrangement for easily and quickly attaching and detaching card guides to PCC connectors to form the receptacle.

The use of printed circuit cards in the field of electronics has become wide spread as a result of their convenience, flexibility, minimal space requirements and reduced production costs. The predominance of printed circuit cards is due in great part to the ease and speed with which circuit card components are connected to other system components merely by plugging the card into a PCC connector. The PCC connector is usually an oblong block of electrical insulating material having a plurality of electrical conductors each with a pin and contact portion. The conductors are embedded in the block of insulating material and arranged in columnar fashion with the contact portions along or in an elongated aperture or card receiving slot formed in the block, the pins protruding laterally from the block. A printed circuit card having circuit contacts disposed along an edge thereof is received into the slot of the connector block. As the edge of the PCC is received in the connector slot, the contact portions of the conductors in the slot and the circuit contacts on the PCC are pressed together to make electrical contact with one another. The pin portions of the conductors are wired or otherwise connected to other system components, e.g., via other connector pins, and the circuit contacts are connected to components on the card; therefore, the mere insertion of the card in the connector slot completes the various electrical connections between the card and other system components.

The PCC is commonly guided into place in the connector by a pair of card guides having slotted guideways, each guide being located at or near one end of the connector and extending outwardly from the end in a plane with the elongated aperture of the connector to receive and guide one edge of the card. The guides may also serve as a support for the PCC once the card is inserted into the connector.

It is common practice for electronic equipment manufacturers to establish at least one standard size for printed circuit cards and their associated mounting and interconnection hardware, and then make or purchase edge connectors having card guides already attached at either end thereof for use with printed circuit cards of the standard size. For standard size PCC's and connectors, one guide is required at each end of each connector. This facilitates rapid assembly of the electronic equipment since most of the PCC's are of the standard size. If larger than standard PCC's are used, then two or more standard connectors may be combined so that the card receiving slots are aligned longitudinally to accommodate the larger printed circuit card. In the latter case, only one card guide is required at either of the outboard ends of the aligned assembly of connectors. It is necessary, therefore, to remove the unneeded central card guides. Thus, it is important that the guides be easily and quickly removable. Many commercially available card guides are attached to connectors or the frames which hold the connectors by means of screws or other types of fasteners so that hand tools are required whenever the card guides are attached or removed. The use of hand tools imposes a burden on the equipment manufacturer since this is cumbersome and time consuming, particularly in view of substantial number of connectors utilized in modern equipment and the difficulty of maneuvering tools in the congested equipment spaces where the connectors and PCC's are located.

Some prior art guides can be attached and detached without the use of tools. These guides, however, have an inherent disadvantage in that they often fail to provide a firm support for the printed circuit cards and they are not easily and quickly detachable from the connectors. For example, one type of card guide is wedged into an aperture and held in place merely by a force fit. Such a means of attachment is undesirable since the card guide can be easily dislodged and therefore does not provide a reliable support for the printed circuit cards. Another prior art card guide is held in place in an aperture through the use of dimples located on the card's periphery so that once the card guide is in place it becomes very difficult to release.

Electronic equipment is subject to environmental stress (e.g., vibration) during operation which tends to cause printed circuit cards to work loose from their receptacles, resulting in open electrical circuits. Some prior art receptacles having a PCC gripping means have failed to provide means for locking the PCC in place to prevent migration of the card out of the connector.

It is, therefore, a broad object of the present invention to provide an improved printed circuit card receptacle.

It is another object of the present invention to provide an improved printed circuit card receptacle including a connector for receiving a pluggable element, and a card guide attached to the connector for guiding the pluggable element into the connector and holding the pluggable element therein.

An additional object of the invention is to provide a new and improved printed circuit card guide and connector assembly which permits card guides to be attached to and detached from connectors quickly, easily and conveniently without the use of tools.

It is still another object of the invention to provide an improved pluggable element receptacle of a standard size having a facile means for converting the receptacle to receive pluggable elements larger than the standard size.

It is a further object of the present invention to provide a new and improved printed circuit card guide and connector assembly which provides a firm and rigid support for the printed circuit card.

SUMMARY OF THE INVENTION

The foregoing and other objects and advantages are achieved in accordance with the invention claimed by providing a mountable receptacle for receiving a pluggable circuit element. The receptacle comprises a connector having a channel member at either end thereof for receiving a card guide. Each card guide has a sleeve portion at one end which is slideably engageable with the channel member of the connector.

The card guide includes means for locking the card guide in place on the connector. The locking means comprises a resilient member which is deflected from its normal position by contact with the channel member as the sleeve portion of the card guide envelopes the channel member, and which snaps back to its normal position when engagement of the channel member and sleeve portion is complete. A detent on the locking means engages a shoulder on the channel member to restrict relative sliding movement between the connector and card guide. To remove the card guide from the connector, the detent is released by applying pressure to a finger tab. A second locking means is provided for holding the printed circuit card in the receptacle.

The materials utilized to form the connector and the card guide provide strength for structural support, and resiliency where required to facilitate facile insertion, retention and disengagement of card guides and pluggable circuit elements.

DETAILED DESCRIPTION OF THE PREFERRED EMBODIMENT

Figure 1:
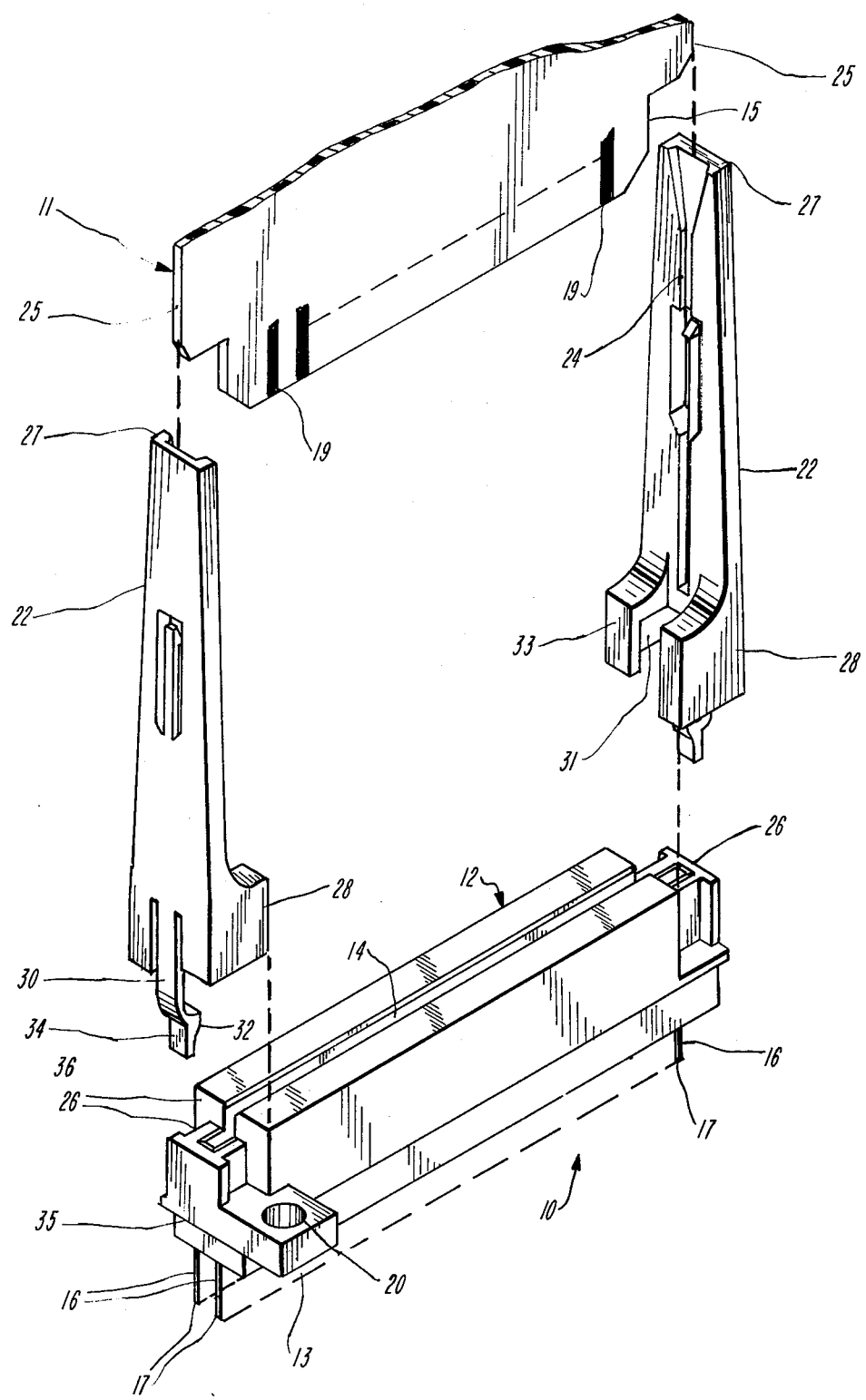
FIG. 1 is an exploded isometric view of the printed circuit card receptacle of the present invention.
Figure 2:
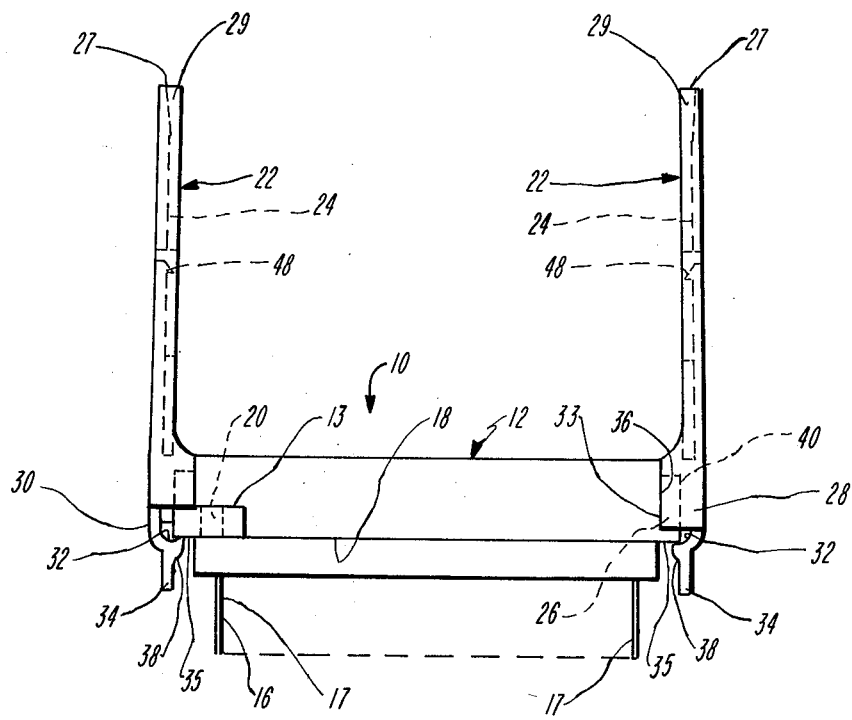
FIG. 2 is a side elevation view rotated 90° of the receptacle with card guides affixed to the connector.

Referring now to the various views of the drawings for a more detailed description of the construction, operation and other features of the invention by characters of reference, FIGS. 1 and 2 illustrate the general features of a receptacle 10 for receiving and holding a pluggable element 11 such as a printed circuit card (PCC). The receptacle includes a connector 12 formed of electrical insulating material in the shape of an oblong block having a longitudinal aperture or slot 14 for receiving an edge 15 of the printed circuit card 11. A plurality of electrical conductors 16 each having a pin portion 17 and a contact portion (not shown) are embedded in the connector block 12, the contact portions being arranged in a columnar fashion along or in the slot 14. A plurality of circuit contacts 19 are disposed along the edge 15 of the PCC 11. As the edge 15 of the PCC 11 is received in the slot 14, the contact portions of the conductors in the slot and the circuit contacts 19 on the PCC 11 make electrical contact with one another. When the PCC 11 is in place in the receptacle 10, each of the circuit contacts 19 is pressed against a corresponding one of the contact portions of the electrical conductors 16, which terminate in the pin portions 17. The pins 17 are connected as by wiring to other connector pins so that the electrical components (not shown) located on the PCC 11 are interconnected with electrical components located on other cards inserted in the other connectors.

Figure 4:
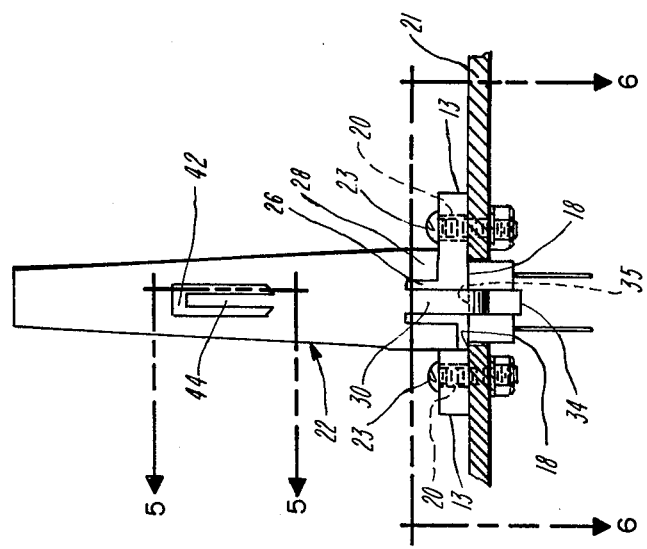
FIG. 4 is a top view of the card guide and connector assembly.

A flange 18, see FIGS. 2 and 4, formed as an integral part of the connector 12 and having a lug 13 at each end of the connector 12 is utilized for mounting the connector 12 in an equipment cabinet. Referring momentarily to FIG. 4, the lugs 13 are secured to a backpanel or structural member 21 by means of a fastener 23 such as a bolt or a screw inserted through a hole 20 of the lug 13.

Referring again to FIGS. 1 and 2, the printed circuit card 11 is guided into place and held by a pair of opposing card guides 22 located at either end of the connector 12. Each card guide 22 is attached to an end of the connector and extends outwardly therefrom in cantilevered fashion. Except for the attachment to the connector 12, the card guides 22 are otherwise unsupported. The card guide 22 comprises a sleeve portion 28 and an arm portion 27 depending from the sleeve portion 28. Each arm portion 27 has a longitudinal guideway or groove 24 in which a side edge 25 of the printed circuit card 11 is slideably received as the card is inserted between the opposed arm portions 27 for guiding into the connector 12. The guideway 24 is expanded at the extended end of the arm portion 27 to provide a funnelform opening 29 for receiving the edge 25 of the card. The guideways 24 are conveniently disposed in the same plane as the connector slot to receive a planar pluggable element 11. The card guides 22 serve to guide and also secure the card in place, the arm portions 27 of the card guides 22 being so angled with respect to each other that inwardly directed lateral forces are exerted on the card edges 25 in the guideways 24 when the card is emplaced in the receptacle 10. Referring to FIG. 2, the arm portions 27 of the card guides 22 extend from the connector 12 at an angle of slightly less than 90° with the connector. The card guides 22 are so angled with respect to the connector 12 that the arm portions 27 are distended by the PCC to assume a generally mutually parallel position when the printed circuit card is inserted, the resiliency of the material utilized to form the guides 22 imparting a spring-like tension to the guides so that the arm portions 27 grip the edges 25 of the PCC. The flexure of the card guides 22 may alone provide sufficient gripping of the inserted PCC to hold the card and prevent migration of the PCC out of the connector 12; however, under extreme operating conditions (of e.g., vibration and shock) the PCC could work loose, breaking the electrical connections. To preclude such migration from the connector 12 the present invention further provides a PCC locking means which is described in another portion of the specification.

It is important for convenience that the card guides 22 be easily attachable to and removable from the connector 12. Yet it is also important that the joint of the card guide 22 and the connector 12 be strong so that the receptacle provides adequate and firm support for the PCC and the card guides 22 are not dislodged from the assembly 10 by the forces exerted thereon by the PCC or by any other extrinsic force. Both flexibility of the card guides 22 and strength of the joints is achieved by the particular combination of materials utilized to form the elements of the assembly 10. The choice of materials will be treated in detail in the ensuing discussion.

Figure 6:
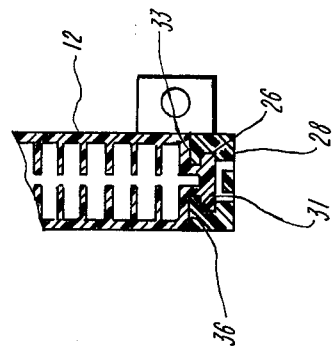
FIG. 6 is a section view taken along 6—6 of FIG. 4 of the interlocked connector channel member and the sleeve portion of the card guide.

A firm but facile joining of the connector 10 and card guide 22 is achieved by providing a channel member 26 at each end of the connector 12 as shown in FIG. 1, which channel member 26 is slideably interlocked with the sleeve portion or mating member 28 formed at one end of the card guides 22. The channel member 26 and the sleeve portion 28 form, respectively, a key and keyway for holding together the connector 12 and the card guide 22. As depicted in FIGS. 1, 4 and 6, card guides 22 are affixed to the connector 12 by sliding the sleeve portion 28 over either of the channel members 26 along an axis or line common to both members 26, 28. Interior walls 31 of the sleeve 28 surround corresponding walls of the pi-shaped channel 26, and an exterior wall 33 of the sleeve 28 abuts an end wall 36 of the connector 12. Consequently, once interlocked with the connector 12 the card guide 22 can be moved only longitudinally along the channel member 26 (i.e., along the common axis of engagement) and cannot be moved laterally with respect thereto. The card guide 22 can thus be easily affixed to and removed from the channel member 26; yet when in place it cannot be dislodged by lateral forces (such as caused by the insertion of a printed circuit card), because the interlocking of the channel 26 and sleeve 28 prevents such lateral movement. To provide an even tighter fit, the interior walls 31 of the sleeve 28 may be slightly tapered so that a compression fit results between the sleeve 28 and channel member 26.

Figure 7:
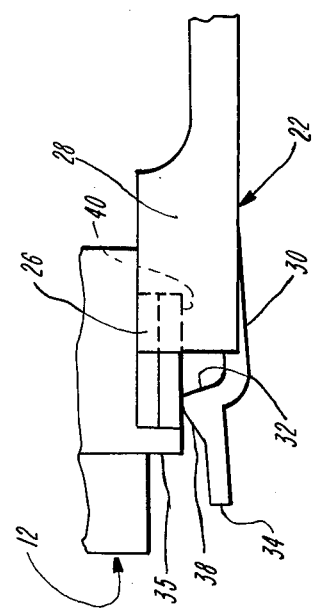
FIG. 7 is a fragmentary side elevation view of a card guide partially engaged with a connector.

To prevent the card guide 22 from sliding out of place, a locking means is integrally formed therewith to restrict relative movement between the sleeve 28 and channel member 26 along the axis of engagement, when the engagement is complete. The card guide locking means comprises a resilient member 30 depending longitudinally from the card guide adjacent the sleeve portion 28, a detent or locking tab 32 for engaging a shoulder 35 of the connector 12 locking the card guide 22 in place, and a finger tab 34 for manually releasing the locking tab 32 from the shoulder 35 to permit removal of the guide 22 from the connector 12. A beveled leading edge 38 of the locking tab 32 first comes into contact with an outer surface 40 of the channel member 26 as the sleeve 28 is engaged with the channel member 26. Referring now to FIG. 7, as the sleeve 28 engages the channel member 26 the leading edge 38 of the locking tab contacts the outer surface 40 of the channel member 26 forcing the resilient member 30 from its normal longitudinal position, outwardly from the channel member 26. When the sleeve 28 reaches full engagement with the channel member 26, see FIG. 2, the locking tab 32 passes the shoulder 35 releasing the resilient member 30 to spring back to its normal longitudinal position. Thus, the locking tab 32 of the card guide 22 engages and catches the shoulder 35 of the connector 12. This locks the card guide 22 in place by restricting its movement relative to the channel member 26 so that it cannot slide off the connector 12. Removal of the card guide 22 from the connector 12 is effected by applying pressure to the finger tab 34 to flex the resilient member 30 laterally outward from the connector 12, thus disengaging the locking tab 32 from the shoulder 35 of the connector 12 to permit slideable release of the card guide 22.

Figure 3:
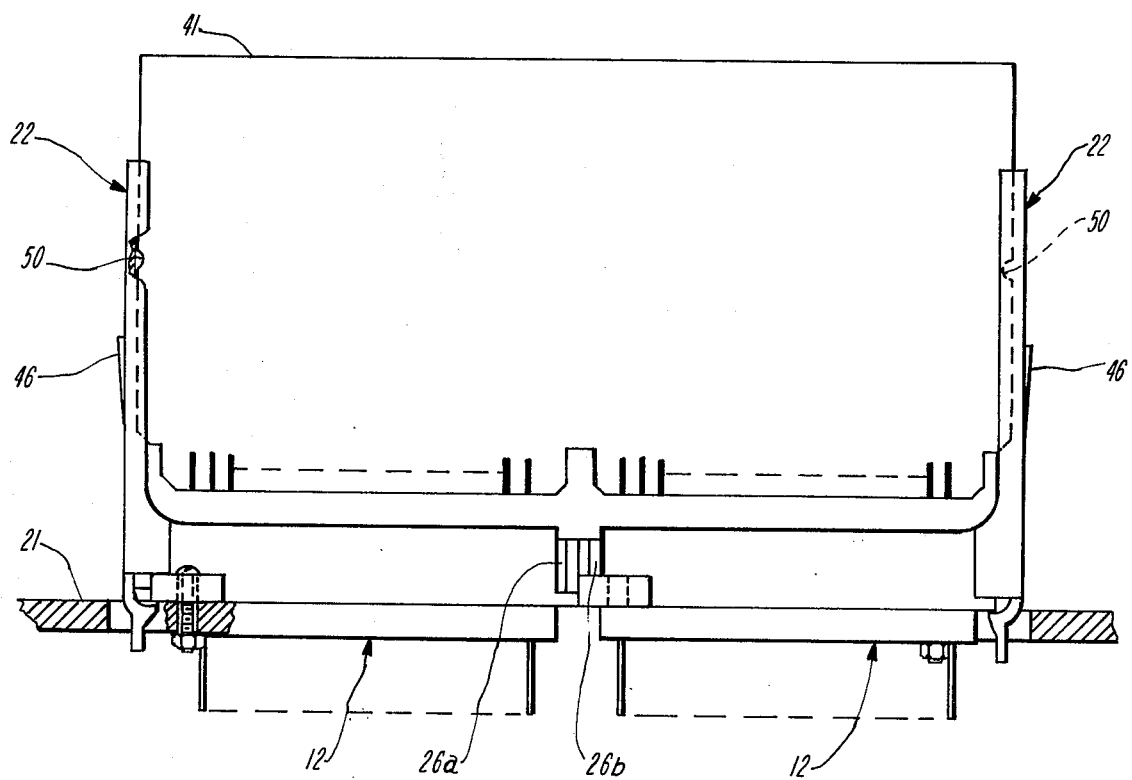
FIG. 3 is a side elevation view rotated 90° of a receptacle formed from two connectors for use with a larger than standard size printed circuit card.

Referring now to FIG. 3, there is shown a receptacle comprising a pair of connectors 12 mounted longitudinally with respect to each other on a backpanel or planar structural member 21 (only partially shown for clarity). A larger than standard size printed circuit card 41 is shown partially inserted into the receptacle. The central channel members 26a, b are shown abutting one another; however, they may be spaced apart. Card guides 22 are installed only at either end of the connector pair. Thus, by merely removing the central card guides, the standard connector 12 may be adapted along with other connectors to form a receptacle for receiving large PCC's.

Figure 5A:
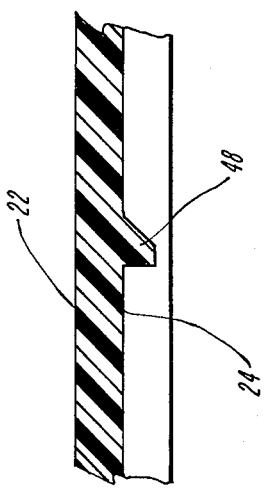
FIG. 5a shows another embodiment of the circuit card locking means.
Figure 5:
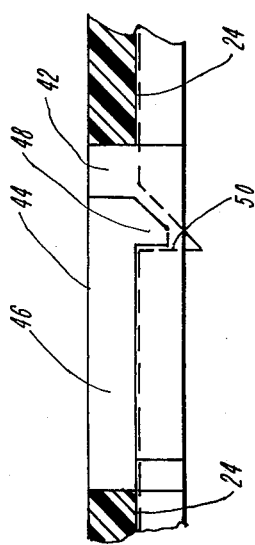
FIG. 5 is a detail view taken along line 5—5 of FIG. 4 of the circuit card locking means.

The present invention further provides in combination with the receptacle an integral means for locking the PCC in the receptacle. Referring to FIGS. 3, 4 and 5, each card guide includes a void 42 through the arm portion 27 of the guide and the slotted guideway 24. Formed integrally with the guide 22 and extending therefrom into the void 42 is a PCC locking means 44. The locking means 44 comprises a spring portion 46 and a catch 48 for engaging a notch 50 (see FIG. 2) formed in the edge of the PCC. The resiliency of the material utilized to form the card guide 22 allows the spring portion 46 to be flexed laterally outward from its normal longitudinal position when a PCC is inserted into the slotted guideway 24, as illustrated in FIG. 2. When the PCC 41 is fully engaged in the receptacle, see FIG. 5, the catch 48 is released and springs back into the notch 50, the position of which notch is indicated by the dashed line of FIG. 5. Another embodiment of the PCC locking means is shown in FIG. 5a, wherein a catch 48 is formed as a protrusion in the slotted guideway 24 of the card guide. The entire card guide 22 is forced laterally outward as the PCC is inserted into the guideway 24 and forced against the catch 48. Then, similarly to the earlier described embodiment, the catch 48 engages a notch in the edge of the fully inserted PCC and the card guide springs back into place. The notch 50 is easily formed in the edge of the PCC, however, it is understood that such a notch is not required if the catch 48 is located to engage the end of the inserted PCC.

As previously stated, the combination of materials utilized to form the receptacle contributes to the efficacy of the device. In order to provide strong support for the electrical conductors 16 embedded in the connector 12, as well as adequate structural support for the card guides and the pluggable element 11, a relatively-hard plastic material having good dimensional stability and dielectric loss properties was chosen for the connector. A relatively-hard material is defined as one having tensile strength from 5–27 thousand psi, tensile elastic modulus from 8–50 psi $\times$ $10^5$, and elongation from 0.1–5%. A variety of materials, both thermoplastic and thermosetting, may be utilized for molding the connector and card guides, either by transfer or injection molding techniques, preferably in a one-step operation utilizing automatic high-speed molding equipment. Materials suitable for making the connector 12 include polycarbonate, polyaryl sulfone, phenolformaldehyde and phenol-furfural molding compounds, thermoplastic polyester, ETFE, phenylene oxide based resins and ployimide. Glass fiber or other reinforcing materials or fillers are utilized to achieve the necessary strength and dimensional stability within the bounds of the aforementioned parameters.

The card guides 22 are preferably formed from a relatively-resilient material, i.e., less hard and more elastic than the connector 12 material. The card guide material should provide sufficient strength to support the load carried (i.e., the PCC 11) and withstand the pressure and forces applied to the interlocking sleeve portion 28, and yet be sufficiently elastic to preclude rupture when the locking means are actuated. A relatively-resilient material is defined as one having high tensile strength (6–15 thousand psi) and a relatively-high tensile elastic modulus (2–12 psi × $10^5$) combined with moderate elongation (4–300%) and good creep and cold flow resistance. Suitable materials include nylon, acetal homopolymer, polycarbonate, polyaryl sulfone, ETFE and ECTFE fluoroplastics, thermoplastic polyester, polysulfone and polyamide. The material may be reinforced, filled or extended to enhance one or more of its physical properties. The properties defined herein are in accordance with the American Society for Testing and Materials (ASTM) Standards, 1972.

Both the connector and the card guide may be molded from the same material with acceptable results; however, tests showed that the combination of a relatively-hard material having little elongation (<1%) for the connector, and a relatively-resilient material for the guide provided the highest strength joint without rupturing the channel member, while retaining adequate strength with resiliency as described hereinbefore for the extended arm portion and locking means of the card guide. Considering both cost and performance tests, the preferred materials were found to be glass fiber filled phenol-formaldehyde molding compound (elongation 0.2%, tensile elastic modulus 19–33×$10^5$ psi) for the connector 12, and 20% glass fiber reinforced type 6/6 nylon for the card guide 22. Cellulose-filled phenolic molding compound, though acceptable, proved to be somewhat brittle.

I have described above the preferred embodiment of a novel printed circuit card receptacle which is inexpensively manufactured and quickly and easily installed. The card guide and connector assembly of the present invention provides a facile means for affixing and interlocking card guides with connectors without the use of tools. The card guide may be easily attached to and removed from the connector, while the choice of materials for the interlocking members, coupled with the locking means assures a strong and secure joint so that once emplaced the card guide cannot be accidentally dislodged from the assembly. No additional support extrinsic of the connector is required for the card guides. Further, the choice of materials contributes to the efficiency of the receptacle in retaining the printed circuit card in place.

While the principles of my invention have been made clear in the foregoing description, it will be immediately obvious to those skilled in the art that many modifications of the structure, arrangement, proportions, the elements, material and components may be used in the practice of the invention which are particularly adapted for specific environments without departing from those principles. The appended claims are intended to cover and embrace any such modifications within the limits only of the true spirit and scope of the invention.

What is claimed is:

1. A receptacle for receiving a planar pluggable element and electrically connecting said element with other elements, said receptacle comprising:

a mountable connector for receiving said pluggable element;

a channel member formed at either end of said connector;

a pair of guides each having a sleeve portion at one end thereof and an arm portion, said sleeve portion slideably engageable along a common axis with said channel member to affix said guides to said connector;

a locking means for preventing slideable disengagement of said channel member and said sleeve portion along their common axis, said locking means including a resilient member, deflected by said slideable engagement to an open position, having a detent for locking against a surface of the connector normal to said common axis in a closed position and a finger tab for releasing the locking engagement;

said guides when affixed to said connector having said arm portions mutually opposed for receiving said pluggable element therebetween and guiding said pluggable element to said connector, and spaced apart at ends thereof opposite said one end a distance less than the width of said pluggable element received, said guides formed of a material allowing resilient flexure of said arm portions to grip said pluggable element; and a second locking means for holding said pluggable element in said receptacle formed integrally with said guides including a spring member flexed by said pluggable element received between said arm portions, and a catch engageable with said pluggable element received in said connector.

2. The receptacle as claimed in claim 1, wherein said connector is formed from a relatively-hard material, and said guide is formed from a relatively-resilient material.

3. The receptacle as claimed in claim 2, wherein said relatively-resilient material is nylon with at least twenty percent glass fiber reinforcement.

* * * * *